US012696437B2

(12) United States Patent
Lee et al.

(10) Patent No.: US 12,696,437 B2
(45) Date of Patent: Jul. 28, 2026

(54) SEMICONDUCTOR DEVICES HAVING CONTACT PLUGS

(71) Applicant: SAMSUNG ELECTRONICS CO., LTD., Suwon-si (KR)

(72) Inventors: Jinseong Lee, Suwon-si (KR); Jihye Kwon, Suwon-si (KR); Jihun Kim, Suwon-si (KR); Kyosuk Chae, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 459 days.

(21) Appl. No.: 18/506,405

(22) Filed: Nov. 10, 2023

(65) Prior Publication Data

US 2024/0260250 A1     Aug. 1, 2024

(30) Foreign Application Priority Data

Jan. 31, 2023     (KR) ........................ 10-2023-0012862

(51) Int. Cl.
H10B 12/00          (2023.01)
(52) U.S. Cl.
CPC ....... H10B 12/0335 (2023.02); H10B 12/482 (2023.02); *H10B 12/315* (2023.02)
(58) Field of Classification Search
CPC . H10B 12/0335; H10B 12/482; H10B 12/315
See application file for complete search history.

(56) References Cited

U.S. PATENT DOCUMENTS

| | | | |
|---|---|---|---|
| 8,580,678 B2 | 11/2013 | Hwang | |
| 9,385,130 B2 | 7/2016 | Fukishima | |
| 2020/0194302 A1* | 6/2020 | Ahn | H10B 12/315 |
| 2020/0194374 A1* | 6/2020 | Kim | H10W 20/069 |
| 2021/0398569 A1* | 12/2021 | Hong | H10B 12/315 |
| 2022/0052056 A1 | 2/2022 | Lu et al. | |
| 2023/0109983 A1 | 4/2023 | Lee et al. | |

FOREIGN PATENT DOCUMENTS

KR     10-20200115385     10/2020

* cited by examiner

*Primary Examiner* — Benjamin Tzu-Hung Liu
(74) *Attorney, Agent, or Firm* — Morgan, Lewis & Bockius LLP

(57)          ABSTRACT

A semiconductor device includes a substrate including an active region. A gate structure is disposed in the substrate and extends to traverse the active region in a first horizontal direction. Bit line structures traverse the gate structure and extend in a second horizontal direction, intersecting the first horizontal direction. Fence structures are disposed between the bit line structures. The fence structures are spaced apart from each other in the second horizontal direction. A contact plug is disposed between the bit line structures and between the fence structures. The contact plug includes first and second side surfaces that are spaced apart from each other in the second horizontal direction and third and fourth side surfaces that are spaced apart from each other in the first horizontal direction. A doping concentration of the first side surface is higher than a doping concentration of the third side surface.

20 Claims, 23 Drawing Sheets

III-III'

III-III'

SEMICONDUCTOR DEVICES HAVING CONTACT PLUGS

CROSS-REFERENCE TO RELATED APPLICATION(S)

This application claims priority under 35 U.S.C. § 119 to Korean Patent Application No. 10-2023-0012862 filed on Jan. 31, 2023 in the Korean Intellectual Property Office, the disclosure of which is herein incorporated by reference in its entirety.

TECHNICAL FIELD

The present disclosure relates to a semiconductor device and, more specifically, to a semiconductor device having a contact plug.

DISCUSSION OF THE RELATED ART

In line with growing demand for high performance, high speed, and/or multifunctionality of semiconductor devices, the degree of integration of semiconductor devices has increased. This, in turn, leads to semiconductor devices having fine patterns. In manufacturing semiconductor devices with fine patterns, patterns are formed having a fine width and/or a fine distance.

SUMMARY

A semiconductor device includes a substrate including an active region, a gate structure disposed in the substrate and extending to traverse the active region in a first horizontal direction, bit line structures traversing the gate structure and extending in a second horizontal direction, intersecting the first horizontal direction, fence structures disposed between neighboring pairs of the bit line structures, the fence structures being spaced apart from each other in the second horizontal direction, and a contact plug disposed between neighboring pairs of the bit line structures and between neighboring pairs of the fence structures. The contact plug includes first and second side surfaces spaced apart from each other in the second horizontal direction and third and fourth side surfaces spaced apart from each other in the first horizontal direction. A doping concentration of the first side surface is higher than a doping concentration of the third side surface.

A semiconductor device includes a substrate including an active region, a gate structure disposed in the substrate and extending to traverse the active region in a first horizontal direction, bit line structures traversing the gate structure and extending in a second horizontal direction, intersecting the first horizontal direction, fence structures disposed between neighboring pairs of the bit line structures, the fence structures being spaced apart from each other in the second horizontal direction, and a contact plug disposed between neighboring pairs of the bit line structures and between neighboring pairs the fence structures. The contact plug includes an embedded portion, a first region, and a second region disposed on the embedded portion. A doping concentration of the first region is higher than a doping concentration of the second region. The first region is disposed along an upper surface of the contact plug and/or a side surface of the contact plug. A doping concentration of the contact plug over a depth in a vertical direction is highest on the upper surface of the contact plug and/or the side surface of the contact plug.

A semiconductor device includes a substrate including an active region, a gate structure disposed in the substrate and extending to traverse the active region in a first horizontal direction, a first bit line structure and a second bit line structure extending to traverse the gate structure in a second horizontal direction, intersecting the first horizontal direction, the first bit line structure and the second bit line structure being spaced apart from each other in the first horizontal direction, spacer structures covering side surfaces of the first bit line structure and the second bit line structure, a first fence structure and a second fence structure disposed between the first bit line structure and the second bit line structure, the first fence structure and the second fence structure being spaced apart from each other in the second horizontal direction, a contact plug disposed between the first bit line structure and the second bit line structure and between the first fence structure and the second fence structure, and a landing pad disposed on the contact plug. The contact plug includes a first side surface contacting the first fence structure, a second side surface contacting the second fence structure, a third side surface facing the first bit line structure, and a fourth side surface facing the second bit line structure. Doping concentrations of the first side surface and the second side surface are higher than doping concentrations of the third side surface and the fourth side surface.

BRIEF DESCRIPTION OF DRAWINGS

The above and other aspects and features of the present inventive concept will be more clearly understood from the following detailed description, taken in conjunction with the accompanying drawings, in which.

DETAILED DESCRIPTION

Hereinafter, example embodiments of the present inventive concept will be described with reference to the accompanying drawings.

Figure 1:
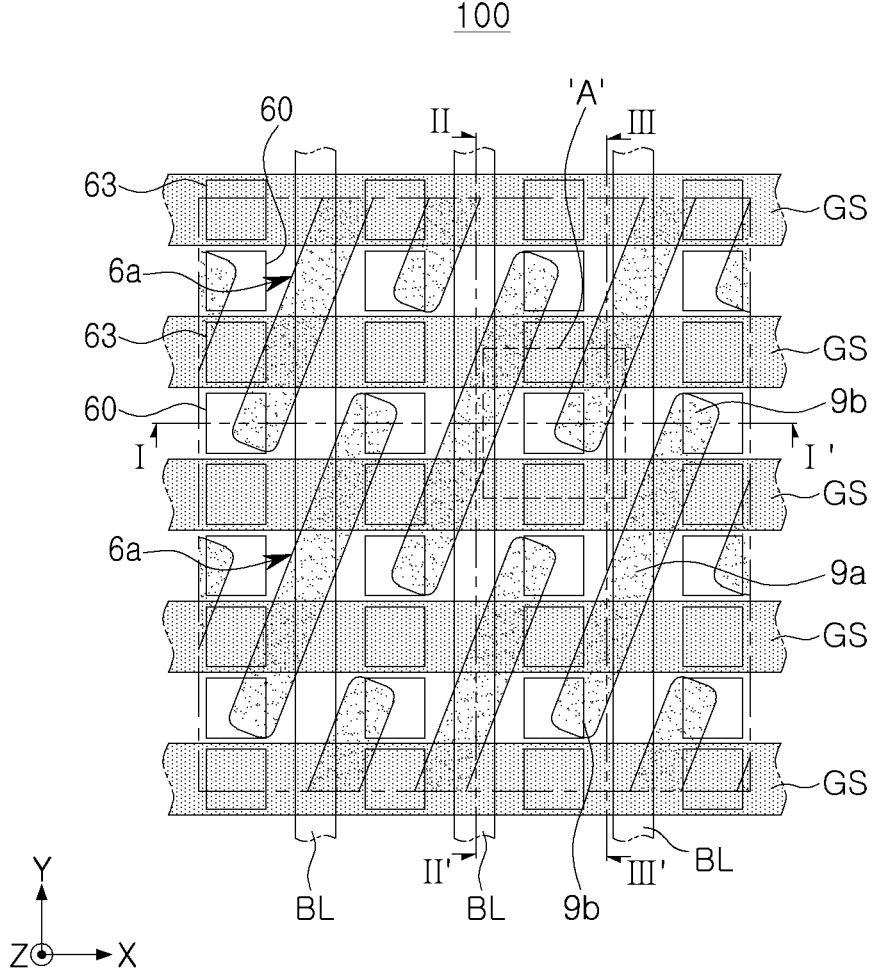
FIG. 1 is a plan view of a semiconductor device according to an embodiment.
Figure 2A:
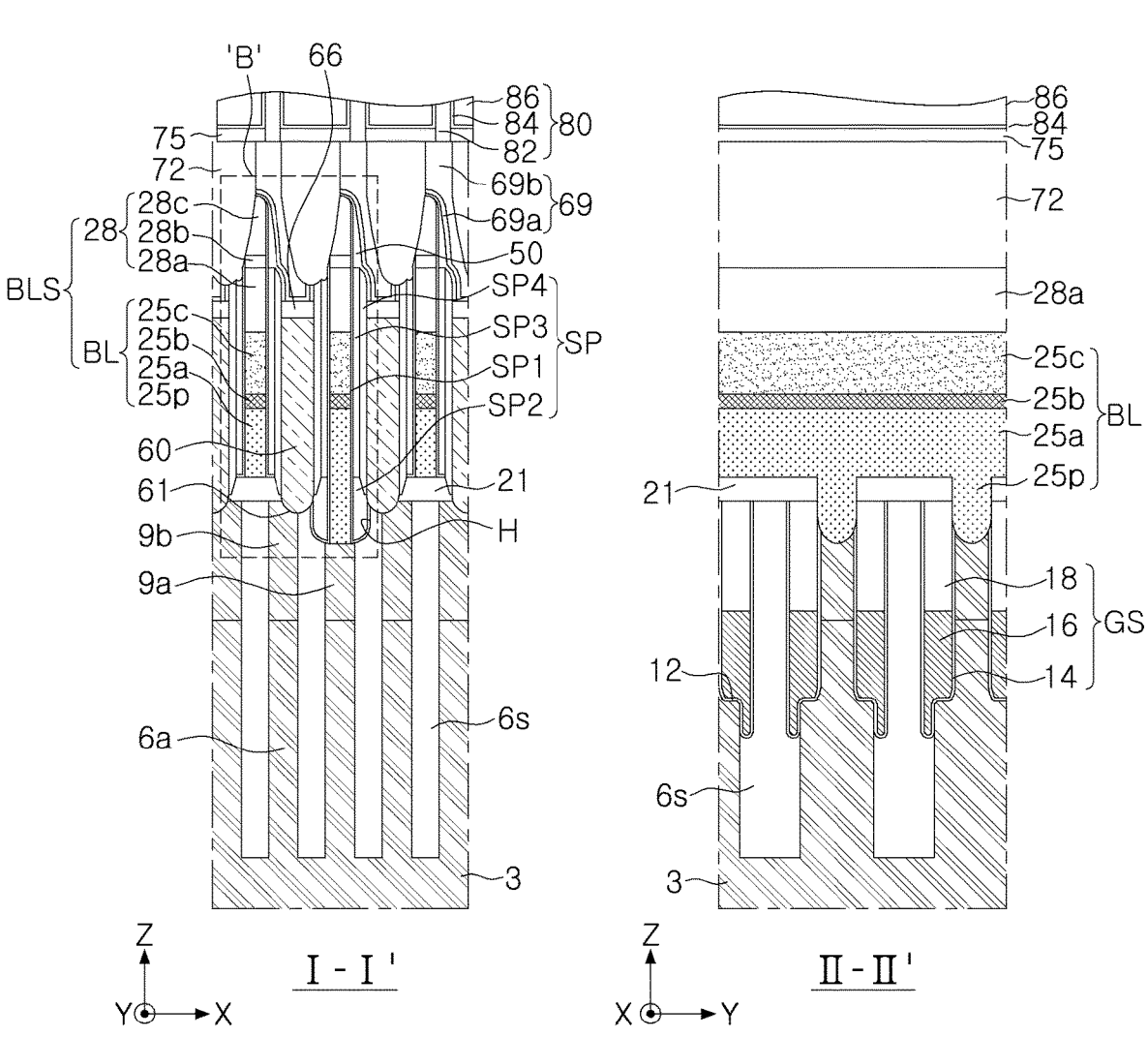
FIG. 2A is vertical cross-sectional views of the semiconductor device illustrated in FIG. 1 taken along lines II-I' and II-II'.
Figure 2B:
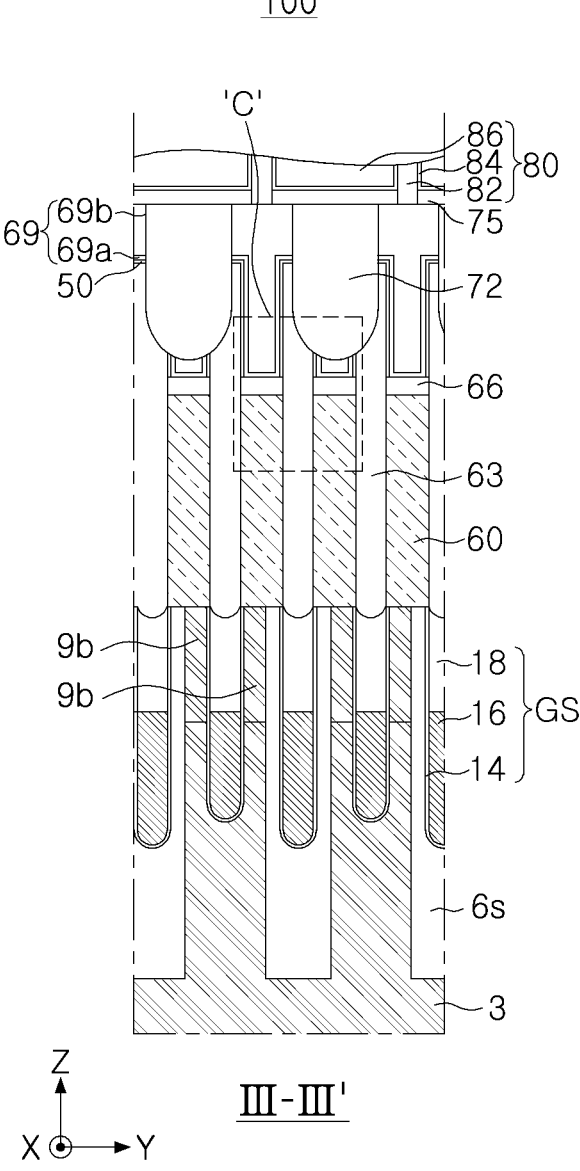
FIG. 2B is a vertical cross-sectional view of the semiconductor device illustrated in FIG. 1 taken along the line III-III'.

FIG. 1 is a plan view of a semiconductor device according to an embodiment. FIG. 2A is vertical cross-sectional views of the semiconductor device illustrated in FIG. 1 taken along lines II-I' and II-II'. FIG. 2B is a vertical cross-sectional view of the semiconductor device illustrated in FIG. 1 taken along the line III-III'.

Referring to FIGS. 1, 2A, and 2B, a semiconductor device 100, according to an embodiment of the present inventive concept, may include a substrate 3, a gate structure GS, a buffer layer 21, a bit line structure BLS, a spacer structure SP, a contact plug 60, a landing pad 69, and a capacitor structure 80. The semiconductor device 100 may be applied to, for example, a cell array of a dynamic random access memory (DRAM), but is not necessarily limited thereto.

The substrate 3 may include a semiconductor material, such as a group IV semiconductor, a group III-V compound semiconductor, or a group II-VI compound semiconductor. For example, the group IV semiconductor may include silicon, germanium or silicon-germanium. The substrate 3 may be a silicon substrate, a silicon on insulator (SOI) substrate, a germanium substrate, a germanium on insulator (GOI) substrate, a silicon-germanium substrate, or a substrate including an epitaxial layer.

The substrate 3 may include an active region 6a, a device isolation layer 6s, a first impurity region 9a, and a second impurity region 9b. The device isolation layer 6s may be an insulating layer extending downwardly from an upper surface of the substrate 3 and may define the active region 6a. For example, the active region 6a may correspond to a portion of an upper surface of the substrate 3 surrounded by the device isolation layer 6s. In a plan view, the active region 6a may have a bar shape having a minor axis and a major axis, and may extend in a direction inclined with respect to an X-direction and a Y-direction.

The active region 6a may include first and second impurity regions 9a and 9b extending from the upper surface of the substrate 3 to a predetermined depth. The first and second impurity regions 9a and 9b may be spaced apart from each other. The first and second impurity regions 9a and 9b may serve as source/drain regions of a transistor. For example, a drain region may be formed between two gate structures GS traversing one active region 6a, and a source region may be formed outside each of the two gate structures GS. For example, the first impurity region 9a may correspond to the drain region, and the second impurity region 9b may correspond to the source region. The source region and the drain region may be formed by first and second impurity regions 9a and 9b by doping or ion implantation of substantially the same impurities, and may be referred to interchangeably depending on a circuit configuration of a finally formed transistor. The first and second impurity regions 9a and 9b may include impurities having a conductivity type opposite to that of the substrate 3. For example, the active regions 6a may include p-type impurities, and the first and second impurity regions 9a and 9b may include n-type impurities.

The device isolation layer 6s may extend downwardly from the upper surface of the substrate 3 and may define the active regions 6a. The device isolation layer 6s may at least partially surround the active regions 6a and may separate the active regions 6a from each other. The device isolation layer 6s may include silicon oxide, silicon nitride, silicon oxynitride, or combinations thereof, and may be formed of a single layer or a plurality of layers.

In a plan view, the gate structures GS may extend in the X-direction and may be spaced apart from each other in the Y-direction. In addition, the gate structures GS may traverse the active region 6a. As used herein, the term "traverse" may mean to extend across a portion of or an entirety of a given region. For example, two gate structures GS may cross one active region 6a. Transistors each including the gate structure GS and the first and second impurity regions 9a and 9b may constitute a buried channel array transistor (BCAT), but are not necessarily limited thereto.

In a cross-sectional view, the gate structures GS may be embedded in the substrate 3, and for example, the gate structures GS may be disposed inside a gate trench 12 formed in the substrate 3. The gate structure GS may include a gate dielectric layer 14, a gate electrode 16, and a gate capping layer 18 disposed inside the gate trench 12. The gate dielectric layer 14 may be conformally formed on an inner wall of the gate trench 12. The gate electrode 16 may be disposed on a lower portion of the gate trench 12, and a gate capping layer 18 may be disposed on an upper portion of the gate structure GS and fill the gate trench 12. A portion of an upper surface of the gate capping layer 18 may be coplanar with an upper surface of the device isolation layer 6s, and a portion of the upper surface of the gate capping layer 18 may have an upwardly concave curved surface, with respect to the substrate 3.

The gate dielectric layer 14 may include silicon oxide or a high-k material. A high-k material may be understood to be any material having a dielectric constant greater than that of silicon oxide. In embodiments, the gate dielectric layer 14 may be a layer formed by oxidation of the active region 6a or a layer formed by deposition. The gate electrode 16 may include a conductive material, for example, polycrystalline silicon (Si), titanium (Ti), titanium nitride (TiN), tantalum (Ta), tantalum nitride (TaN), tungsten (W), tungsten nitride (WN), and/or aluminum (Al). Alternatively, the gate electrode 16 may include a combination of titanium nitride (TiN) and polysilicon. The gate capping layer 18 may include silicon nitride.

The buffer layer 21 may be disposed on the active region 6a, the device isolation layer 6s, and the gate structure GS. The buffer layer 21 may include silicon oxide, silicon nitride, silicon oxynitride, or combinations thereof. The buffer layer 21 may include a single layer or multiple layers.

The bit line structures BLS may extend in the Y-direction and may be spaced apart from each other in the X-direction. The bit line structure BLS may have a bar shape extending in the Y-direction. The bit line structure BLS may include a bit line BL and a bit line capping layer 28 on the bit line BL. The bit line BL may include a first conductive layer 25a, a second conductive layer 25b, and a third conductive layer 25c sequentially stacked on the buffer layer 21. The first conductive layer 25a may include polysilicon. The second conductive layer 25b may include a metal-semiconductor compound. The metal-semiconductor compound may be, for example, a layer obtained by siliciding a portion of the first conductive layer 25a. For example, the metal-semiconductor compound may include cobalt silicide (CoSi), titanium silicide (TiSi), nickel silicide (NiSi), tungsten silicide (WSi), and/or other metal silicides, and/or may include nitrides, such as TiSiN. The third conductive layer 25c may include a metal material, such as titanium (Ti), tantalum (Ta), tungsten (W), or aluminum (Al). The bit line BL may further include a plug portion 25p disposed below the first conductive layer 25a and extending downwardly to contact the second impurity region 9b. The plug portion 25p may be located in a contact hole H formed on the upper surface of the substrate 3. In a plan view, the plug portion 25p may contact a central portion of the active region 6a. The plug portion 25p may electrically connect the active region 6a to the bit line structure BLS. The plug portion 25$p$ may include the same material as that of the first conductive layer 25$a$.

The bit line capping layer 28 may include a first insulating layer 28$a$, a second insulating layer 28$b$, and a third insulating layer 28$c$ disposed on the bit line BL. Side surfaces of the first insulating layer 28$a$ may be coplanar with the first conductive layer 25$a$, the second conductive layer 25$b$, and the third conductive layer 25$c$. The first insulating layer 28$a$, the second insulating layer 28$b$, and the third insulating layer 28$c$ may include silicon oxide, silicon nitride, silicon oxynitride, or combinations thereof and may include, for example, silicon nitride.

The spacer structures SP may be disposed on both side surfaces of the bit line structures BLS, and may extend in the Y-direction along the side surfaces of the bit line structures BLS. The spacer structure SP may include a first spacer SP1, a second spacer SP2, a third spacer SP3, and a fourth spacer SP4 disposed on the side surfaces of the bit line structures BLS. The first spacer SP1 may be conformally disposed on the side surfaces of the bit line structure BLS and the contact hole H. The second spacer SP2 may be disposed on the first spacer SP1 and may at least partially fill the contact hole H. The third spacer SP3 may cover the side surface of the first spacer SP1, and the fourth spacer SP4 may cover the side surface of the third spacer SP3. The third spacer SP3 and the fourth spacer SP4 may cover the upper surface of the second spacer SP2. The first spacer SP1, the second spacer SP2, the third spacer SP3, and the fourth spacer SP4 may include silicon oxide, silicon nitride, silicon oxynitride, or combinations thereof. In an embodiment, the first spacer SP1 and the fourth spacer SP4 may include silicon nitride, the second spacer SP2 may include silicon oxide, and the third spacer SP3 may include an air gap. The spacer structure SP of the present inventive concept may be an example, and the material and the number of layers are not necessarily limited thereto and may be variously changed.

The contact plug 60 may be disposed between the bit line structures BLS and may contact the spacer structures SP. As used herein, when an element is described as being disposed between other structures, it is to be understood that the element is disposed between some but not necessarily all neighboring pairs of those other structures. In a plan view, the contact plugs 60 may be disposed between the bit line structures BLS and between the gate structures GS.

A lower end of the contact plug 60 may be located on a level that is lower than that of the upper surface of the substrate 3, and an upper surface (60_U in FIG. 4 to be described below) of the contact plug 60 may be on a level that is lower than that of an upper end of the bit line structure BLS. The contact plug 60 may extend into the substrate 3 to contact the second impurity region 9$b$ of the active region 6$a$ and may be electrically connected to the second impurity region 9$b$. A portion of the contact plug 60 located inside the substrate 3 and contacting the second impurity region 9$b$ may be referred to as an embedded portion 61. The contact plug 60 may be formed of a conductive material and may include, for example, polysilicon (Si), titanium (Ti), titanium nitride (TiN), tantalum (Ta), tantalum nitride (TaN), tungsten (W), tungsten nitride (WN), and/or aluminum (Al). In an embodiment, the contact plug 60 may include doped polysilicon and may include n-type impurities, such as phosphorus (P), arsenic (As), and/or antimony (Sb). For example, a doping concentration of the contact plug 60 may be about $1\times10^{20}$ atom/cm$^3$ to about $6\times10^{20}$ atom/cm$^3$.

A fence structure 63 may be disposed between the bit line structures BLS and may overlap the gate structure GS in a vertical direction. The fence structures 63 may be alternately disposed with the contact plugs 60 in the Y-direction. The fence structures 63 may spatially separate the contact plugs 60 from each other and may electrically insulate them from each other. The fence structure 63 may have a bar or column shape extending in a vertical direction. A lower surface of the fence structure 63 may contact the gate capping layer 18 of the gate structure GS. In an embodiment, the lower surface of the fence structure 63 may have a downwardly convex curved surface toward the gate capping layer 18, and the upper surface of the gate capping layer 18 may 18 may have an upwardly concave curved surface with respect to the substrate 3. The lower surface of the fence structure 63 may be on a level that is lower than that of the upper surface of the substrate 3. An upper surface of the fence structure 63 may be on a level that is higher than the upper surface 60_U of the contact plug 60, and the lower surface of the fence structure 63 may on a level that is lower than that of the lower surface of the contact plug 60. The fence structure 63 may include an insulating material, for example, silicon nitride. The contact plug 60 and the fence structure 63 illustrated in FIG. 1 may be schematically illustrated to explain a positional relationship with other components, and the size and shape may vary according to embodiments.

Figure 3:
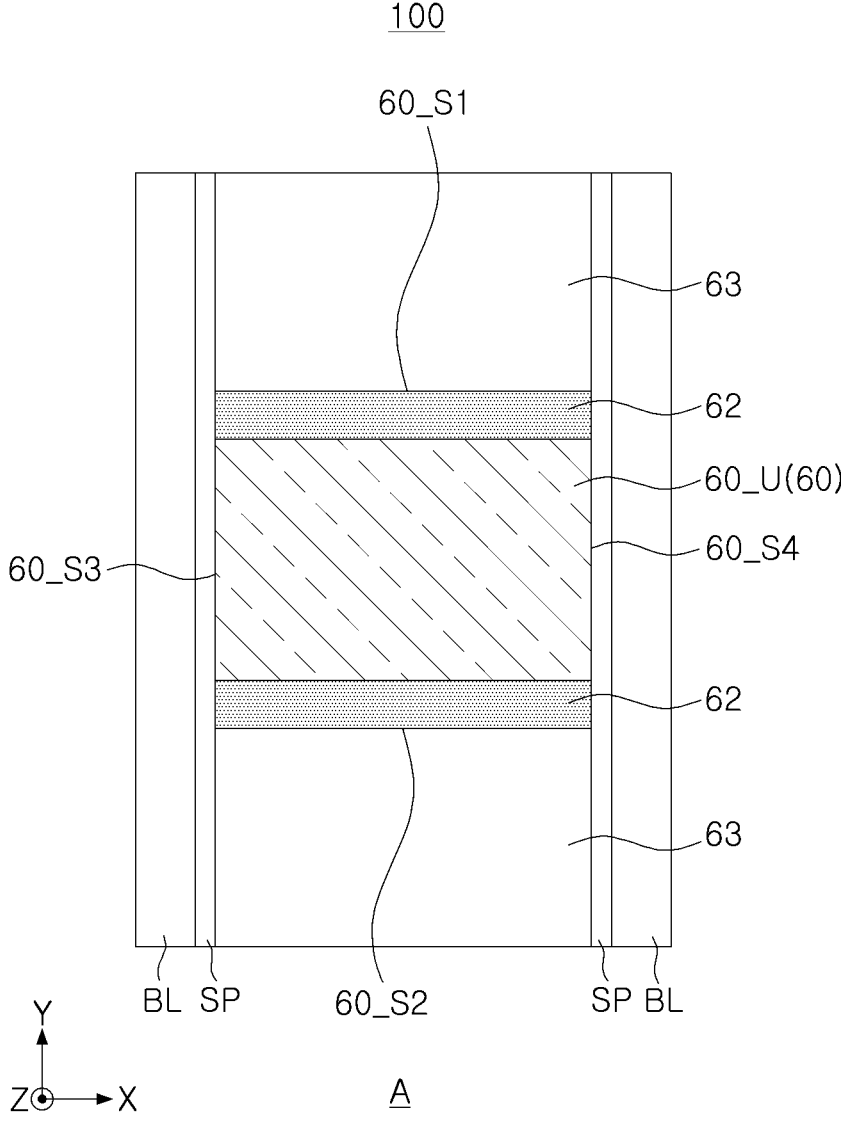
FIG. 3 is an enlarged view of a portion of the semiconductor device illustrated in FIG. 1.
Figure 4:
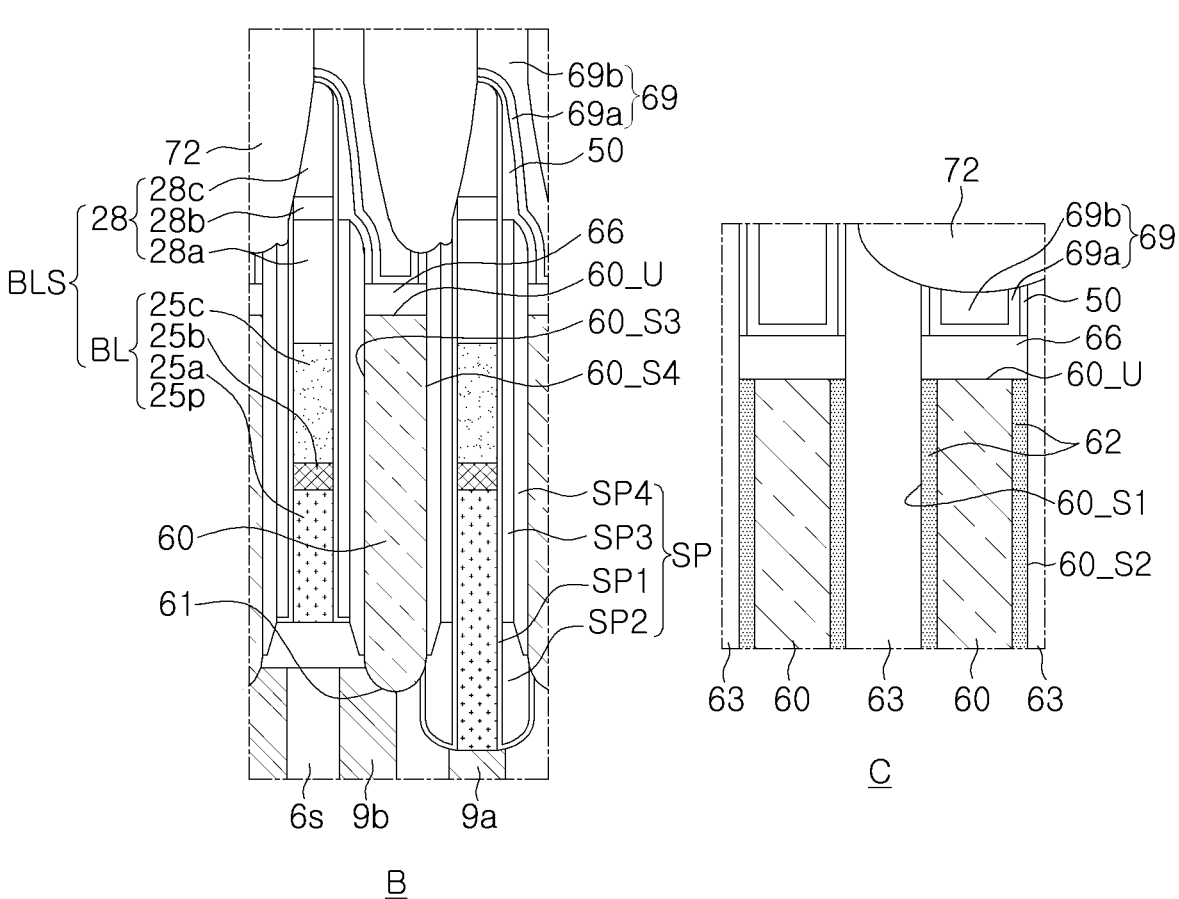
FIG. 4 is an enlarged view of a portion of the semiconductor device illustrated in FIGS. 2A and 2B.
Figure 5:
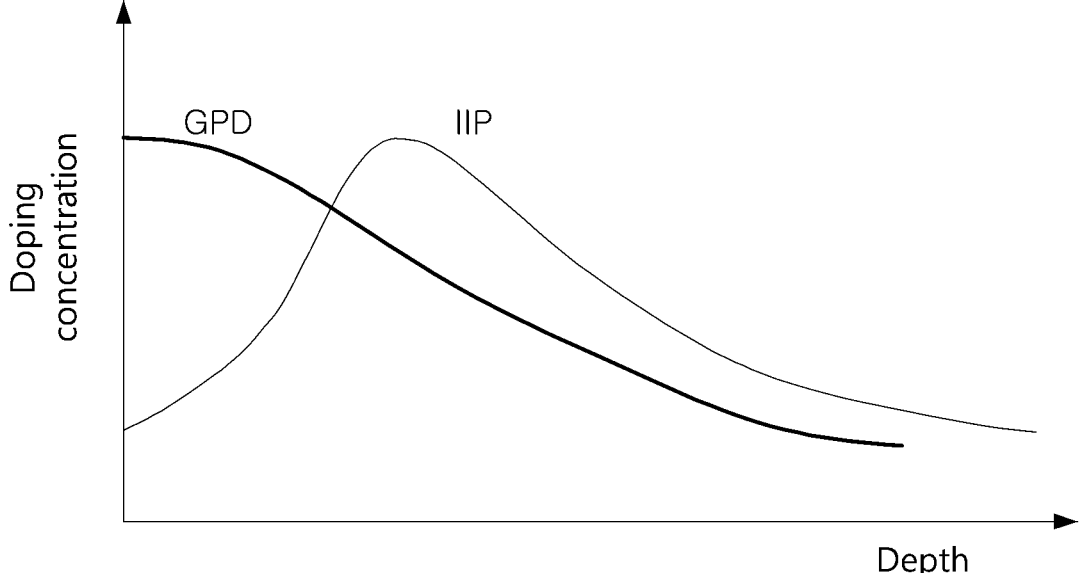
FIG. 5 is a graph illustrating a change in doping concentration over depth.
Figure 6:
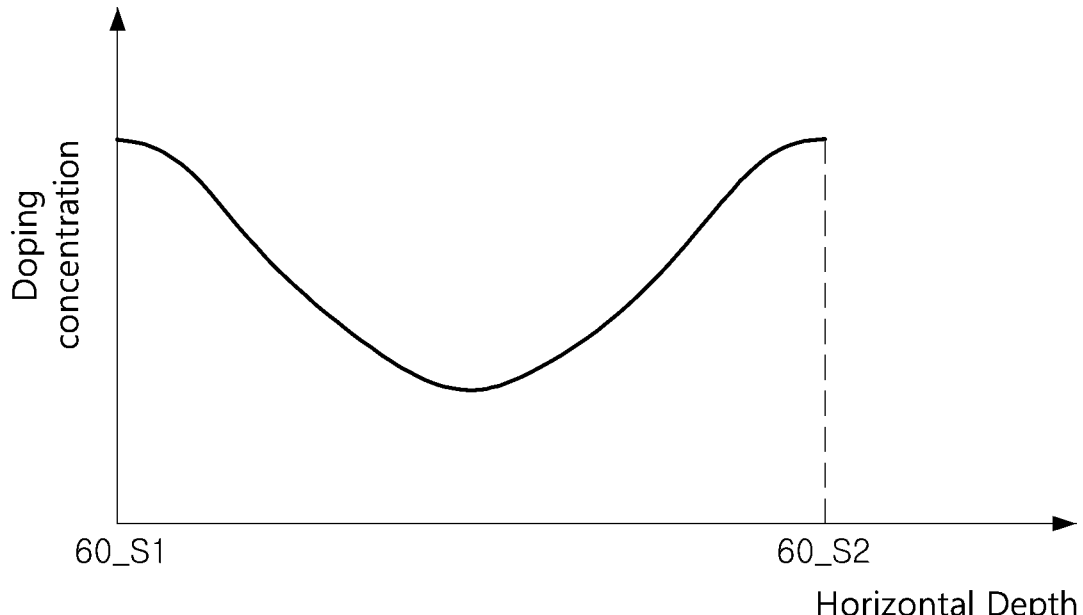
FIG. 6 is a graph illustrating a doping concentration over depth of a contact plug of a semiconductor device according to an embodiment of the present inventive concept.

FIG. 3 is an enlarged view of region A of the semiconductor device illustrated in FIG. 1. FIG. 4 is an enlarged view of regions B and C of the semiconductor device illustrated in FIGS. 2A and 2B. FIG. 3 illustrates a contact plug and A fence structure viewed from an upper plane, and FIG. 4 is a vertical cross-sectional view of each of the contact plug and the fence structure. FIG. 5 illustrates a change in doping concentration over depth. FIG. 6 illustrates a doping concentration over depth of a contact plug of a semiconductor device according to an embodiment of the present inventive concept. For example, FIG. 6 illustrates a doping concentration of the contact plug over depth in the Y-direction on a constant vertical level.

Referring to FIGS. 3 and 4, the contact plug 60 may include the upper surface 60_U, a first side surface 60_S1, a second side surface 60_S2, a third side surface 60_S3, and a fourth side surface 60_S4. The first side surface 60_S1 and the second side surface 60_S2 may be opposite to each other and may be perpendicular to the Y-direction. The third side surface 60_S3 and the fourth side surface 60_S4 may be opposite to each other and may be perpendicular to the X-direction. The first side surface 60_S1 and the second side surface 60_S2 may contact the fence structures 63, and the third side surface 60_S3 and the fourth side surface 60_S4 may contact the spacer structure SP. In an embodiment, doping concentrations of the first side surface 60_S1 and the second side surface 60_S2 may be higher than doping concentrations of the third side surface 60_S3 and the fourth side surface 60_S4. For example, the doping concentrations of the first side surface 60_S1 and the second side surface 60_S2 may be about $3\times10^{20}$ atom/cm$^3$ to about $6\times10^{20}$ atom/cm$^3$. In an embodiment, a doping concentration of the contact plug 60 may vary over a horizontal depth of the side surface. The doping concentration of the contact plug 60 over the horizontal depth will be described with reference to FIGS. 5 and 6.

Referring to FIG. 5, when a semiconductor material, such as silicon, is doped by an ion implantation (IIP) process, the doping concentration may be highest at a specific depth based on the surface on which the ion implantation is performed. However, when a semiconductor material is doped by a gas phase doping (GPD) process, the doping concentration may be highest on the surface and may gradually decrease as the depth increases. Here, the 'gradual decrease' of the doping concentration may refer to a continuous change in the doping concentration. However, FIG. 5 only illustrates the change in doping concentration over the depth from the surface, and a difference between the doping concentration by the ion implantation process and the doping concentration by the GPD process may vary depending on specific process conditions.

Referring to FIG. 6, in an embodiment, the contact plug 60 may be doped by the GPD process. For example, the GPD process may be performed while the first side surface 60_S1 and the second side surface 60_S2 are exposed and the third side surface 60_S3 and the fourth side surface 60_S4 are not exposed. Therefore, as described above, doping concentrations of the first side surface 60_S1 and the second side surface 60_S2 may be higher than doping concentrations of the third side surface 60_S3 and the fourth side surface 60_S4. The doping concentration of the first side surface 60_S1 may be the same as that of the second side surface 60_S2, but is not necessarily limited thereto. In addition, the doping concentration over the horizontal depth in the Y-direction may be highest on the first side surface 60_S1 and/or the second side surface 60_S2. The doping concentration over the horizontal depth in the Y-direction between the first side surface 60_S1 and the second side surface 60_S2 may decrease to a certain depth and then increase again. For example, the doping concentration may have a minimum value between the first side surface 60_S1 and the second side surface 60_S2.

As described above, the third side surface 60_S3 and the fourth side surface 60_S4 might not be exposed during the GPD process, but the doping concentration of the third side surface (60_S3) and the fourth side surface 60_S4 may increase due to impurities introduced through the first side surface 60_S1 and the second side surface 60_S2. The doping concentration of the contact plug 60 between the third side surface 60_S3 and the fourth side surface 60_S4 may be lower than the doping concentration of the first side surface 60_S1 or the doping concentration of the second side surface 60_S2. In an embodiment, the doping concentration of the contact plug 60 over the horizontal depth in the X-direction between the third side surface 60_S3 and the fourth side surface 60_S4 may be constant.

Referring back to FIGS. 3 and 4, the contact plug 60 may include a high-concentration region 62 extending from the first side surface 60_S1 and the second side surface 60_S2 in the Y-direction. Here, the high-concentration region 62 may refer to a portion of the contact plug 60 having a relatively high doping concentration. For example, the doping concentration of the high-concentration region 62 may be about $3 \times 10^{20}$ atom/cm$^3$ to about $6 \times 10^{20}$ atom/cm$^3$. The high-concentration region 62 may be disposed along the first side surface 60_S1 and the second side surface 60_S2, may have a constant thickness from the first side surface 60_S1 and the second side surface 60_S2, and may contact the fence structure 63. Since the high-concentration region 62 is disposed on the first side surface 60_S1 and the second side surface 60_S2 contacting the fence structure 63, the occurrence of a depletion region by electrons trapped in the fence structure 63 may be reduced to prevent an increase in resistance. Accordingly, resistance of the contact plug 60 may be reduced.

In this specification, the high-concentration region 62 may be referred to as a 'first region', and a portion other than the high-concentration region 62 may be referred to as a 'second region'. For example, a doping concentration of a first region may be higher than that of the second region. The upper surface 60_U of the contact plug 60 may include first regions disposed on both sides of the second region and spaced apart from each other in the Y-direction.

As described above, the contact plug 60 may include an embedded portion 61 disposed in the substrate 3 and contacting the second impurity region 9b of the active region 6a. For example, the contact plug 60 may be divided into the embedded portion 61 disposed in the substrate 3 and the first region and the second region disposed on the substrate 3. In an embodiment, the embedded portion 61 may be a portion that is not exposed during the GPD process. The doping concentration of the embedded portion 61 may be lower than those of the first region and the second region.

The semiconductor device 100 may further include a metal-semiconductor compound layer 66 disposed on the upper surface 60_U of the contact plug 60. The metal-semiconductor compound layer 66 may contact a side surface of the spacer structure SP and a side surface of the fence structure 63.

The landing pad 69 may be disposed on the metal-semiconductor compound layer 66 and may include a barrier layer 69a covering the bit line structure BLS, the spacer structure SP, and the fence structure 63 and a metal layer 69b on the barrier layer 69a. The landing pad 69 may be electrically connected to the second impurity region 9b of the active region 6a through the contact plug 60. The metal-semiconductor compound layer 66 may include cobalt silicide (CoSi), titanium silicide (TiSi), nickel silicide (NiSi), tungsten silicide (WSi), or other metal silicide. The barrier layer 69a may include metal nitride, for example, titanium nitride (TiN), tantalum nitride (TaN), and/or tungsten nitride (WN). The metal layer 69b may include a conductive material, for example, titanium (Ti), tantalum (Ta), tungsten (W), and/or aluminum (Al).

The semiconductor device 100 may further include an upper insulating spacer 50 covering upper portions of the bit line structure BLS, the spacer structure SP, and the fence structure 63. The upper insulating spacer 50 may be disposed between the bit line structure BLS and the barrier layer 69a, between the spacer structure SP and the barrier layer 69a, and between the fence structure 63 and the barrier layer 69a.

The semiconductor device 100 may further include an insulating pattern 72 disposed between the landing pads 69. An upper surface of the insulating pattern 72 may be coplanar with an upper surface of the landing pad 69, and the insulating pattern 72 may extend downwardly to partially contact the bit line structures BLS. The insulating pattern 72 may spatially separate the landing pads 69 from each other and electrically insulate them from each other.

The semiconductor device 100 may further include an etch stop layer 75 covering upper surfaces of the landing pad 69 and the insulating pattern 72. The capacitor structure 80 may be disposed on the landing pad 69 and the insulating pattern 72. The capacitor structure 80 may include a lower electrode 82, a capacitor dielectric layer 84, and an upper electrode 86. The lower electrode 82 may pass through the etch stop layer 75 and contact the upper surface of the landing pad 69. The capacitor dielectric layer 84 may cover the lower electrode 82 and the etch stop layer 75, and the upper electrode 86 may cover the capacitor dielectric layer 84. The capacitor structure 80 may be electrically connected to the landing pad 69 and the contact plug 60. The lower electrode 82 and the upper electrode 86 may include a doped semiconductor, a metal nitride, a metal, and/or a metal oxide. The lower electrode 82 and the upper electrode 86 may include, for example, polycrystalline silicon, titanium nitride (TiN), tungsten (W), titanium (Ti), ruthenium (Ru), and/or tungsten nitride (WN). The capacitor dielectric layer 84 may include, for example, high dielectric constant materials, such as zirconium oxide ($ZrO_2$), aluminum oxide ($Al_2O_3$), and/or hafnium oxide ($Hf_2O_3$).

Figure 7:
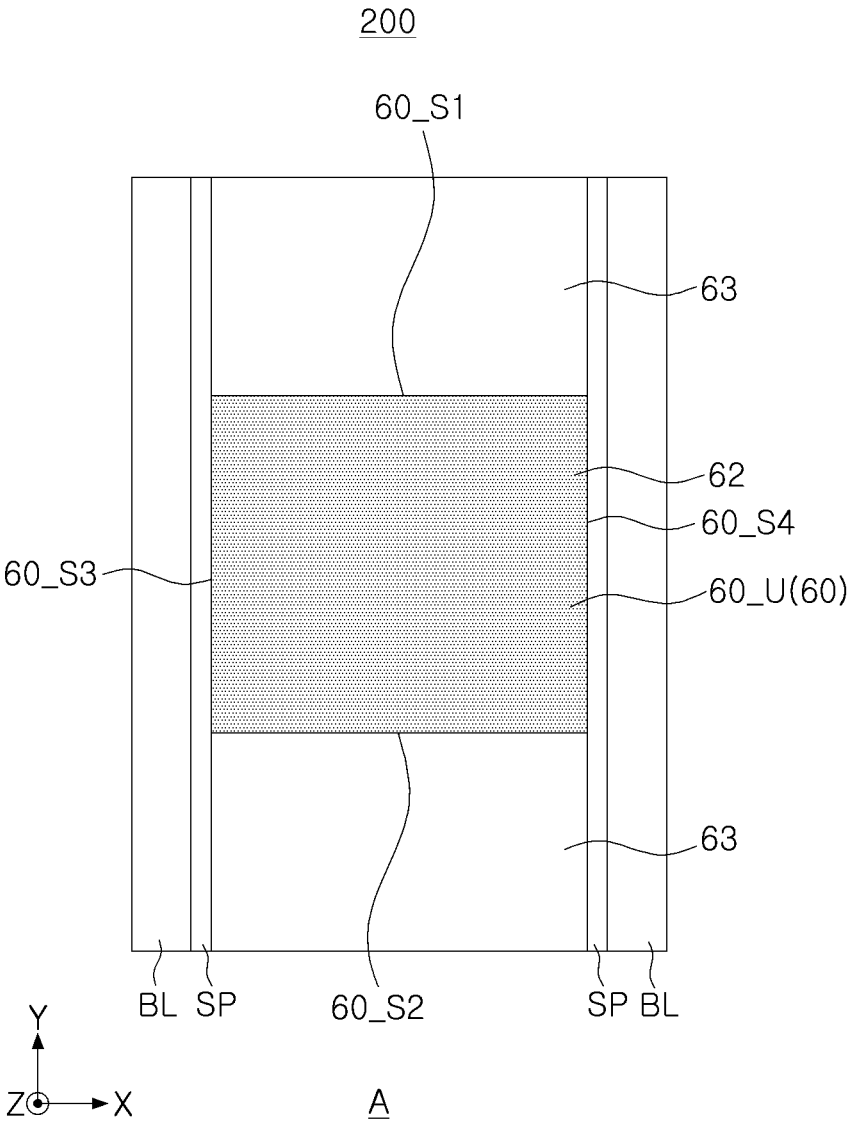
FIG. 7 is a plan view of a semiconductor device according to an embodiment.
Figure 8:
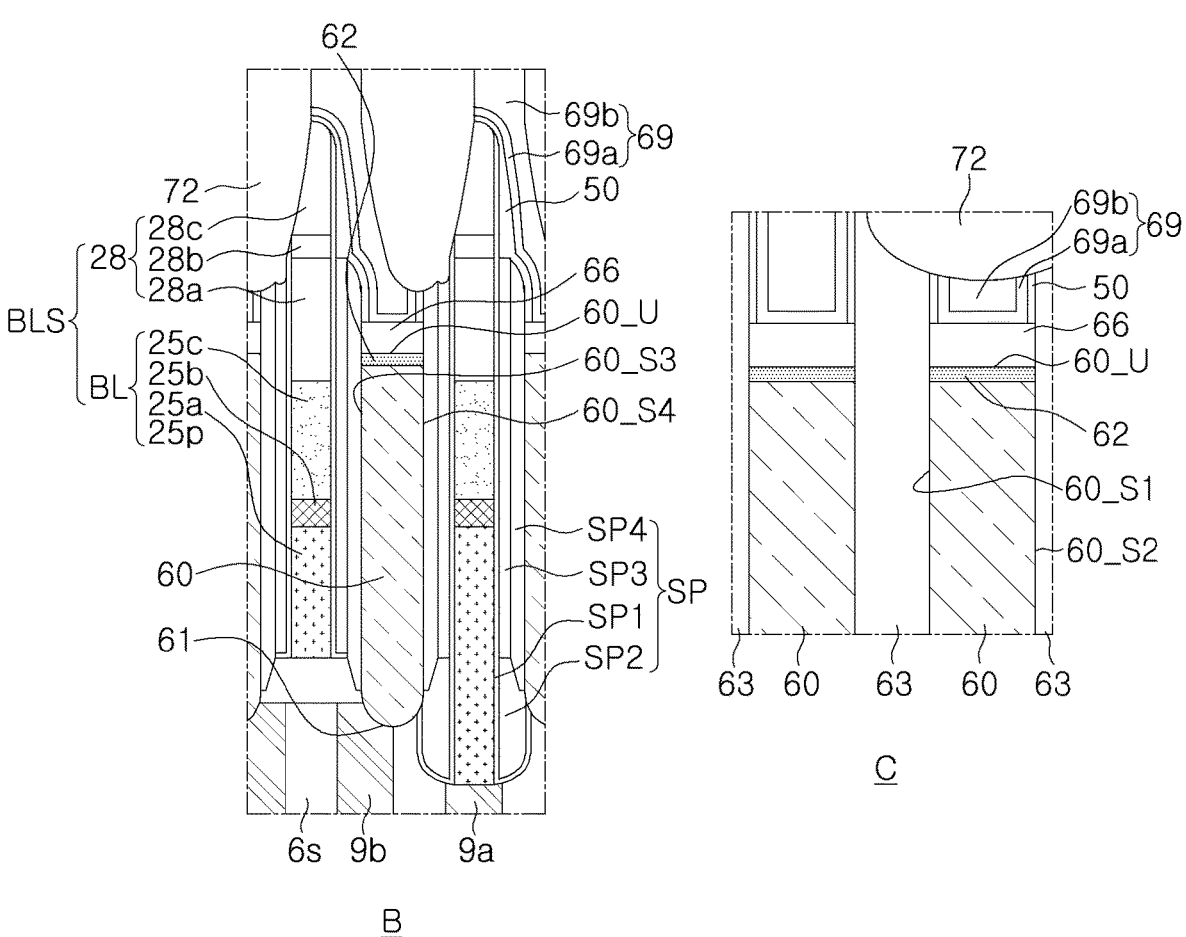
FIG. 8 is a vertical cross-sectional view of a semiconductor device according to an embodiment.

FIG. 7 is a plan view of a semiconductor device according to an embodiment. FIG. 8 is a vertical cross-sectional view of a semiconductor device according to an embodiment.

Referring to FIGS. 7 and 8, the semiconductor device 200 may include the contact plug 60 disposed between bit line structures BLS and between the fence structures 63. In an embodiment, a doping concentration of an upper portion of the contact plug 60 may be higher than a doping concentration of a lower portion of the contact plug 60. For example, the high-concentration region 62 of the contact plug 60 may be disposed on the upper portion of the contact plug 60 and may be disposed along the upper surface 60_U of the contact plug 60. Accordingly, the doping concentration of the contact plug 60 may be highest on the upper surface 60_U, and the doping concentration may gradually decrease as a vertical depth increases from the upper surface 60_U. For example, the contact plug 60 may be doped by the GPD process as described above with reference to FIG. 5 to have such a doping profile. Since the doping concentration of the upper surface 60_U of the contact plug 60 is high, contact resistance with the landing pad 69 disposed on the contact plug 60 may decrease.

In an embodiment, the doping concentration over the horizontal depth in the Y-direction between the first side surface 60_S1 and the second side surface 60_S2 may be constant, and the doping concentration over the horizontal depth in the X-direction between the third side surface 60_S3 and the fourth side surface 60_S4 may be constant.

Figure 9:
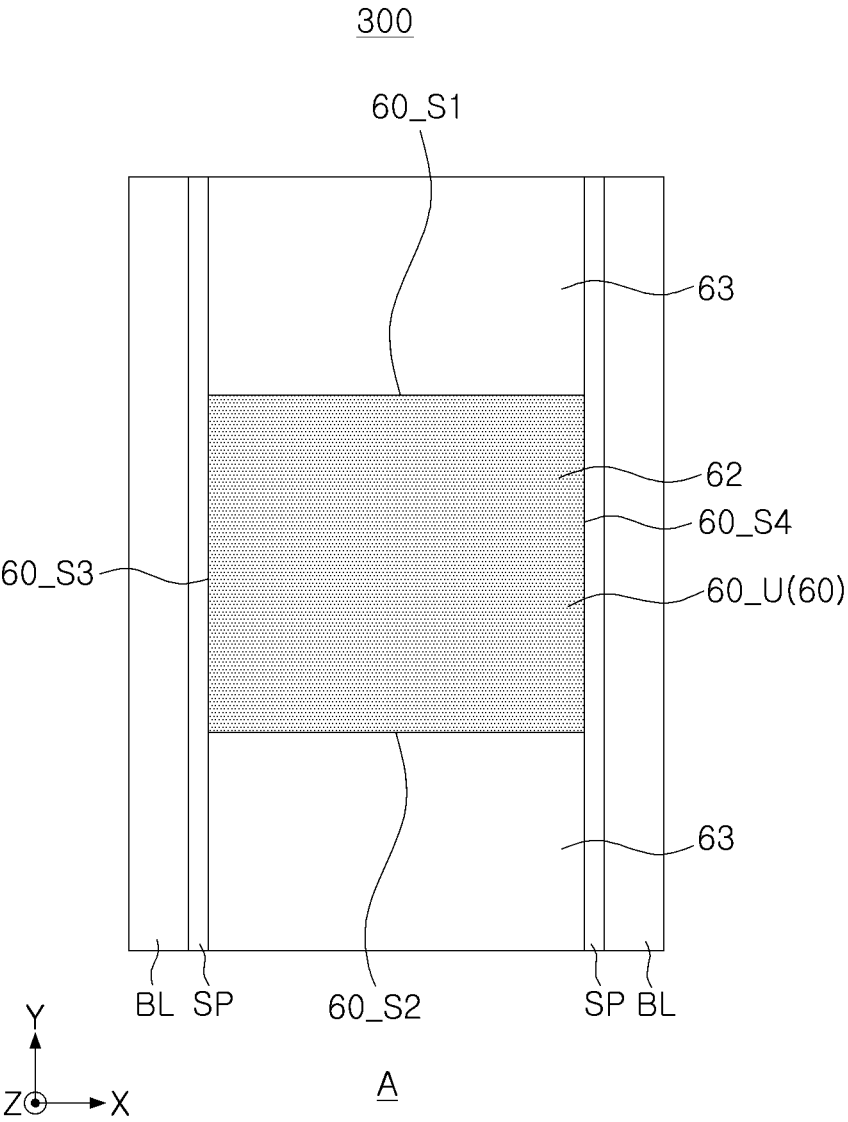
FIG. 9 is a plan view of a semiconductor device according to an embodiment.
Figure 10:
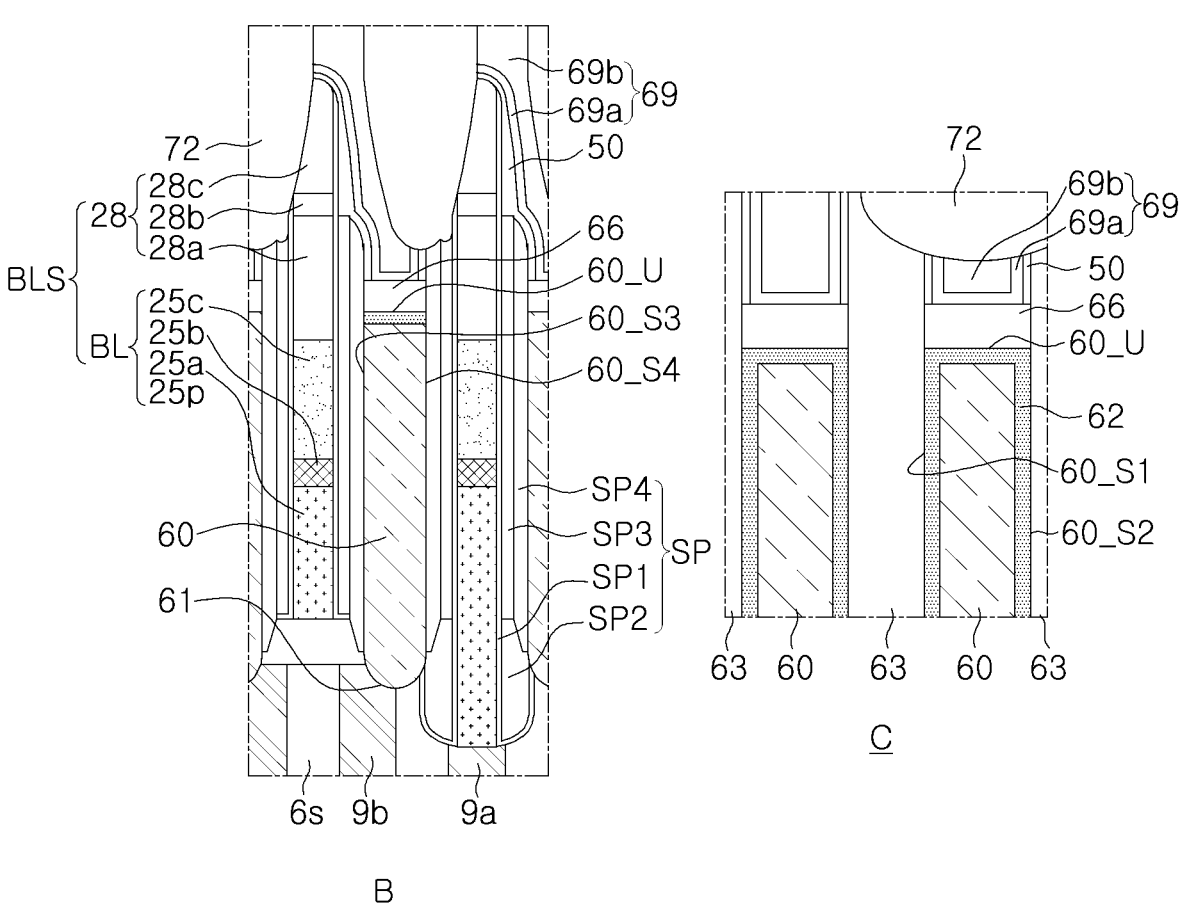
FIG. 10 is a vertical cross-sectional view of a semiconductor device according to an embodiment.

FIG. 9 is a plan view of a semiconductor device according to an embodiment. FIG. 10 is a vertical cross-sectional view of a semiconductor device according to an embodiment.

Referring to FIGS. 9 and 10, a semiconductor device 300 may include the contact plug 60 disposed between the bit line structures BLS and between the fence structures 63. In an embodiment, the high-concentration region 62 of the contact plug 60 may be disposed along the upper surface 60_U, the first side surface 60_S1, and the second side surface 60_S2 of the contact plug 60. The high-concentration region 62 may extend downwardly from the upper surface 60_U of the contact plug 60 and may extend from the first side surface 60_S1 and the second side surface 60_S2 in the Y-direction. Accordingly, the doping concentration of the contact plug 60 may be highest on the upper surface 60_U, the first side surface 60_S1, and/or the second side surface 60_S2. As the vertical depth from the upper surface 60_U of the contact plug 60 increases, the doping concentration may gradually decrease. The doping concentration over the horizontal depth in the Y-direction between the first side surface 60_S1 and the second side surface 60_S2 may decrease to a certain depth and then increase again. For example, the doping concentration over the horizontal depth in the Y-direction may have a minimum value between the first side surface 60_S1 and the second side surface 60_S2. The doping concentration of the contact plug 60 over the horizontal depth in the X-direction between the third side surface 60_S3 and the fourth side surface 60_S4 may be constant.

FIGS. 11A to 16B are vertical cross-sectional views illustrating a sequential process of a method of manufacturing a semiconductor device according to an embodiment. Specifically, FIGS. 11A, 12A, 13A, 14A, 15A, and 16A are vertical cross-sectional views taken along lines I-I' and II-II' of FIG. 1, and FIGS. 11B, 12B, 13B, 14B, 15B, and 16B are vertical cross-sectional views taken along line III-III' of FIG. 1.

Figure 11A:
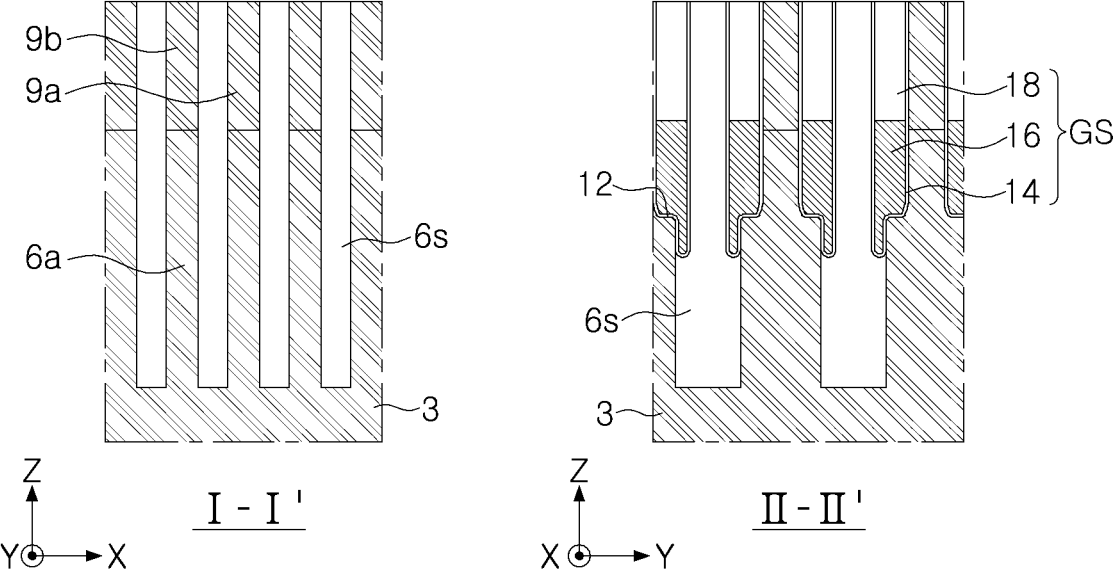
FIGS. 11A to 16B are vertical cross-sectional views illustrating a sequential process of a method of manufacturing a semiconductor device according to an embodiment.
Figure 11B:
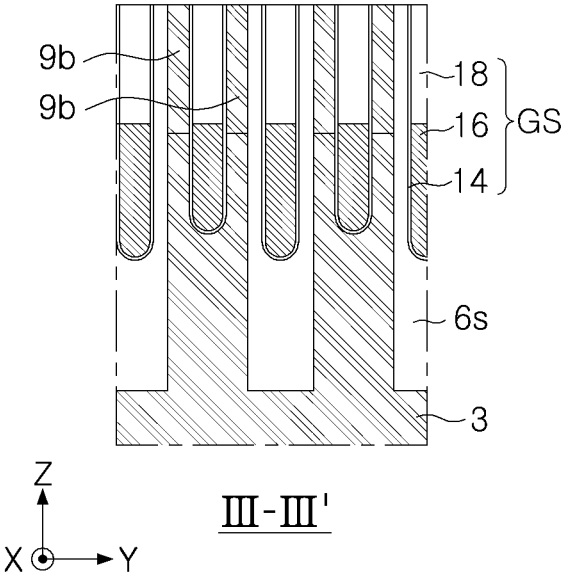

Referring to FIGS. 11A and 11B, the device isolation layer 6s and the gate structure GS may be formed in the substrate 3.

The device isolation layer 6s may be formed by forming a trench in the upper surface of the substrate 3, filling the trench with an insulating material, and performing a planarization process of etching the substrate 3 and the insulating material. The device isolation layer 6s may define active regions 6a. For example, the active regions 6a may correspond to portions of the upper surface of the substrate 3 surrounded by the device isolation layer 6s. In a plan view, the active regions 6a may have a bar shape having a minor axis and a major axis, and may be spaced apart from each other. The device isolation layer 6s may include a single layer or a plurality of layers.

In an embodiment, the first and second impurity regions 9a and 9b may be formed by implanting impurities into the substrate 3 before the device isolation layer 6s is formed. However, according to embodiments, the first and second impurity regions 9a and 9b may be formed after the device isolation layer 6s is formed or during another process.

Thereafter, the substrate 3 may be anisotropically etched to form the gate trenches 12. The gate trenches 12 may extend in the X-direction and may traverse the active region 6a and the device isolation layer 6s. The gate structure GS may be formed by forming the gate dielectric layer 14, the gate electrode 16, and the gate capping layer 18 in the gate trench 12. The gate dielectric layer 14 may 14 may be conformally formed on the inner wall of the gate trench 12. The gate electrode 16 may 16 may be formed by forming a conductive material on the gate dielectric layer 14 and then recessing the conductive material. The gate capping layer 18 may be formed by forming an insulating material on the gate electrode 16 to fill the gate trench 12 and then performing a planarization process. In an embodiment, as illustrated in FIG. 11B, the gate trench 12 may be deeper in the device isolation layer 6s than in the active region 6a.

Figure 12A:
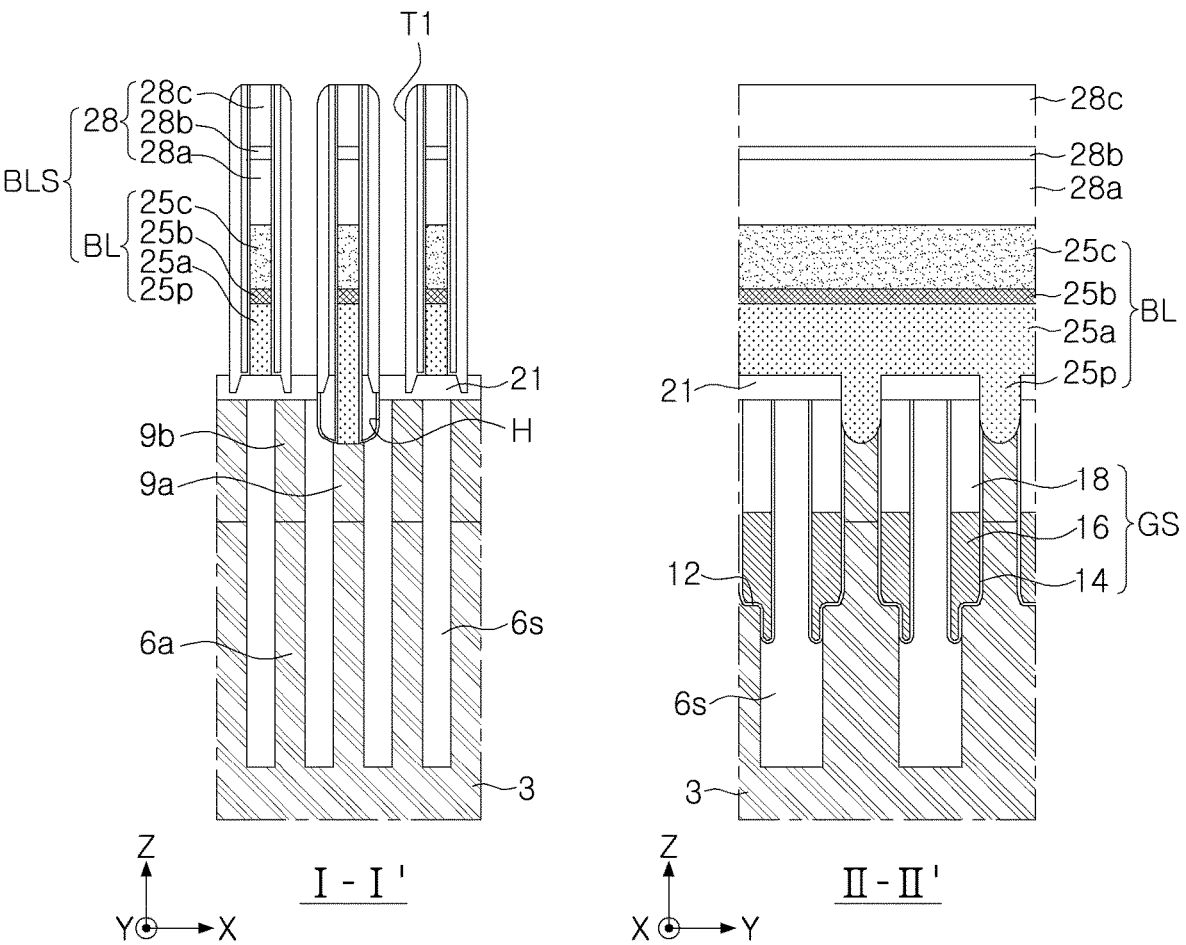
Figure 12B:
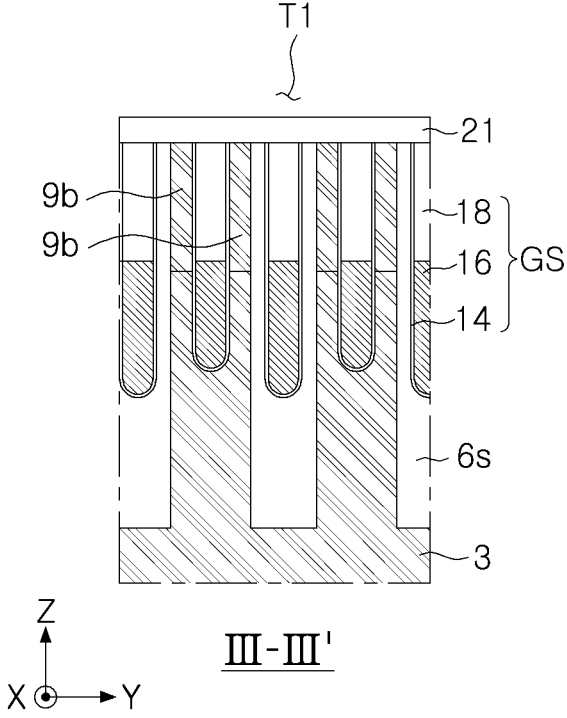

Referring to FIGS. 12A and 12B, the buffer layer 21, the bit line structure BLS, and the spacer structure SP may be formed on the substrate 3. The buffer layer 21 may be formed on upper surfaces of the substrate 3, the active region 6a, the device isolation layer 6s, and the gate structure GS. The buffer layer 21 may include a single layer or a plurality of layers.

The bit line structure BLS may be formed on the buffer layer 21. The bit line structure BLS may be formed by etching the buffer layer 21 such that the active region 6a is exposed, to form the contact hole H, stacking conductive material layers on the contact hole H, forming insulating material layers on the conductive material layers, and then patterning the conductive material layers and the insulating material layers. The bit line structures BLS may extend in the Y-direction and may be spaced apart from each other in the X-direction.

The bit line structure BLS may include the bit line BL including a conductive material and the bit line capping layer 28 including an insulating material. The bit line BL may include the first conductive layer 25a, the second conductive layer 25b, and the third conductive layer 25c being sequentially stacked, and the first conductive layer 25a may include a plug portion 25p disposed in the contact hole H. The bit line capping layer 28 may include the first insulating layer 28a, the second insulating layer 28b, and the third insulating layer 28c being sequentially stacked.

The spacer structure SP may be formed on both side surfaces of the bit line structure BLS. The spacer structure SP may include the first spacer SP1, the second spacer SP2, the third spacer SP3, and the fourth spacer SP4. The first spacer SP1 may be formed by conformally depositing an insulating material along the side surface of the bit line structure BLS and the inner wall of the contact hole H. The second spacer SP2 may be formed by depositing an insulating material on the first spacer SP1 to fill the contact hole H. The third spacer SP3 may cover the side surface of the second spacer SP2, and the fourth spacer SP4 may cover the side surface of the third spacer SP3. The spacer structure SP may extend in the Y-direction along the side surface of the bit line structure BLS. A space between the bit line structures BLS may be referred to as a first trench T1. For example, the first trench T1 may be defined by mutually facing side surfaces of adjacent spacer structures SP and may extend in the Y-direction.

Figure 13A:
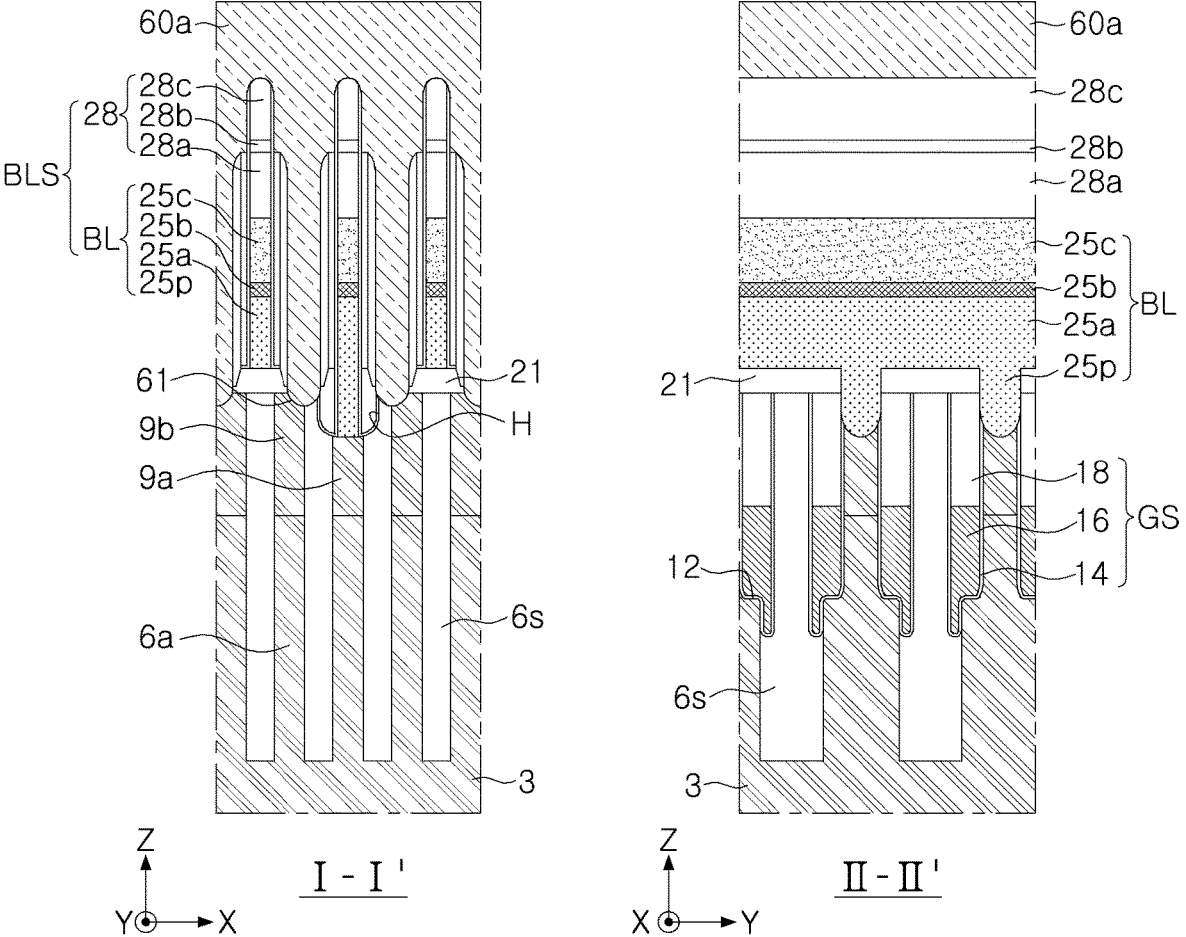
Figure 13B:
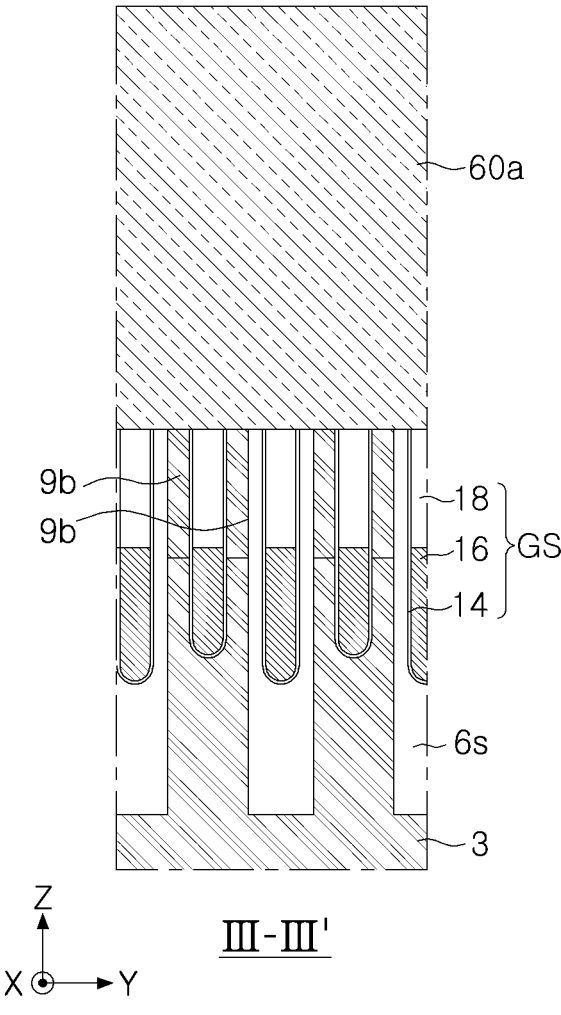

Referring to FIGS. 13A and 13B, a contact conductive layer 60a may be formed in the first trench T1. The contact conductive layer 60a may be formed by etching the buffer layer 21 to expose the active region 6a along the first trench T1 and filling the first trench T1 with a conductive material. The contact conductive layer 60a may contact the upper surface of the active region 6a and may cover the bit line structure BLS and the spacer structure SP. A portion of the spacer structure SP may be etched by the anisotropic etching process. In an embodiment, the contact conductive layer 60a may include doped polysilicon. For example, the contact conductive layer 60a may be deposited and formed in the first trench T1 together with n-type impurities. The contact conductive layer 60a may include phosphorus (P), arsenic (As), and/or antimony (Sb) elements.

A portion of the contact conductive layer 60a may contact the upper surfaces of the active region 6a, the device isolation layer 6s, and the gate structure GS. A portion of the contact conductive layer 60a embedded in the substrate 3 may be referred to as an embedded portion 61. The embedded portion 61 may contact the upper portion of the active region 6a, e.g., the second impurity region 9b, and may be electrically connected to the second impurity region 9b.

Figure 14A:
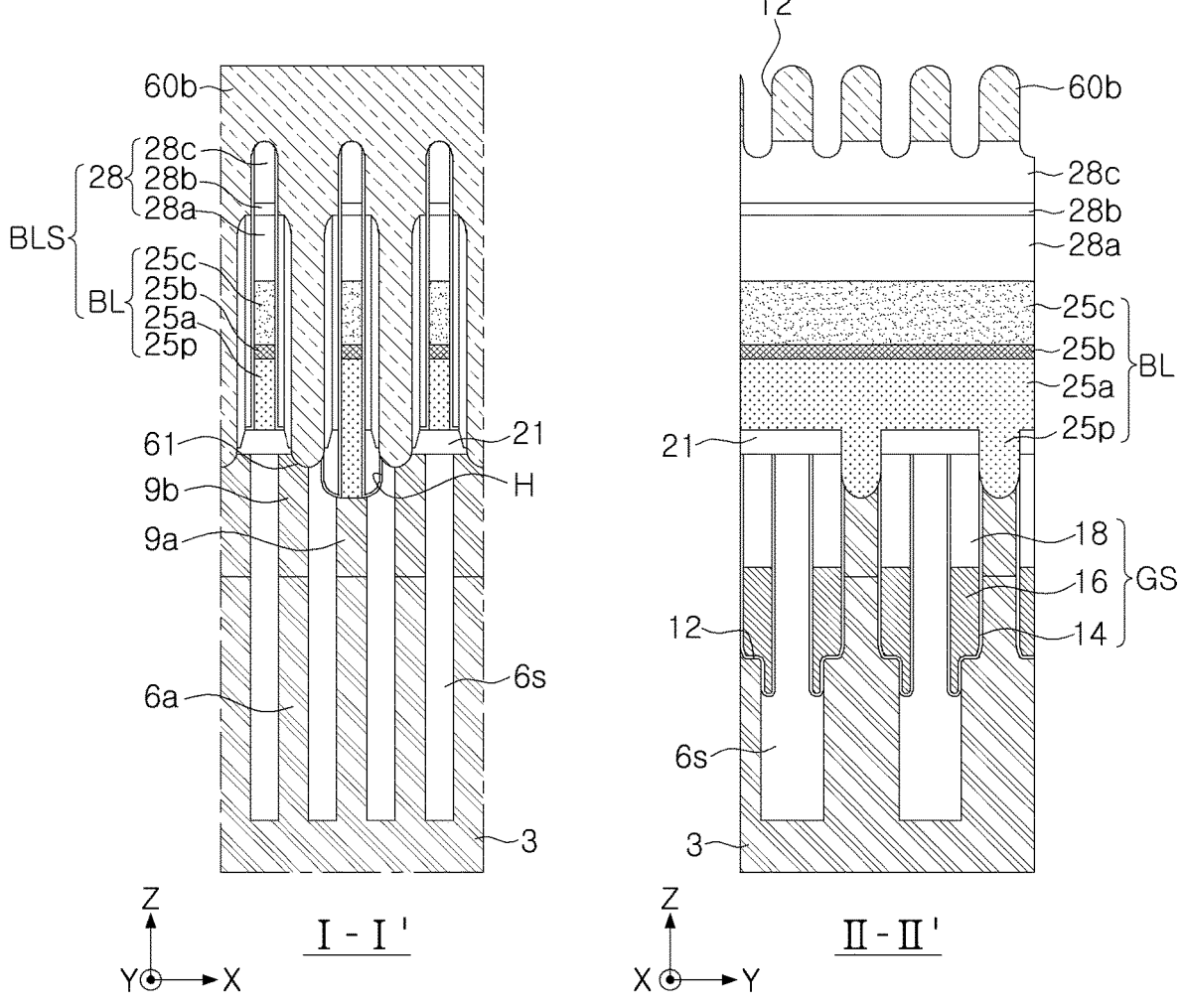
Figure 14B:
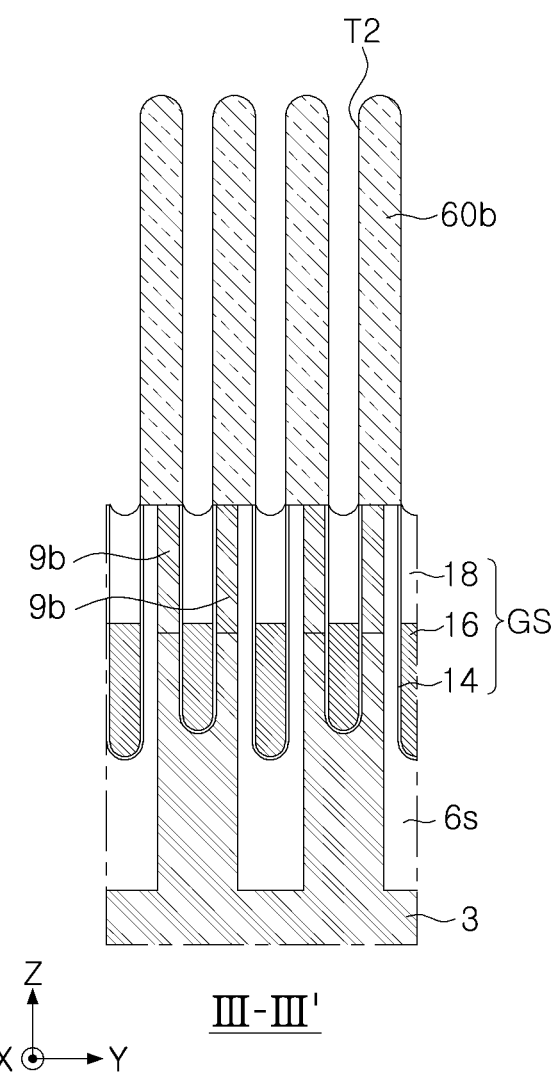

Referring to FIGS. 14A and 14B, the second trench T2 may be formed by anisotropically etching the contact conductive layer 60a. The second trenches T2 may extend in the X-direction and may be spaced apart from each other in the Y-direction. For example, the second trenches T2 may overlap the gate structures GS in a vertical direction. In an embodiment, the upper surface of the third insulating layer 28c may be exposed by the etching process, and the second trench T2 may further extend in a vertical direction toward the inside of the third insulating layer 28c. An upper surface of the gate structure GS may be exposed in the second trench T2, and an upper surface of the gate capping layer 18 may be partially recessed. For example, a portion of an upper surface of the gate capping layer 18 not overlapping the bit line structures BLS in a vertical direction may be recessed.

Through the etching process, the contact conductive layer 60a may be separated into contact conductive patterns 60b. The contact conductive patterns 60b may extend in the X-direction and may be spaced apart from each other in the Y-direction. A side surface of the contact conductive pattern 60b may be exposed by the second trench T2.

Figure 15A:
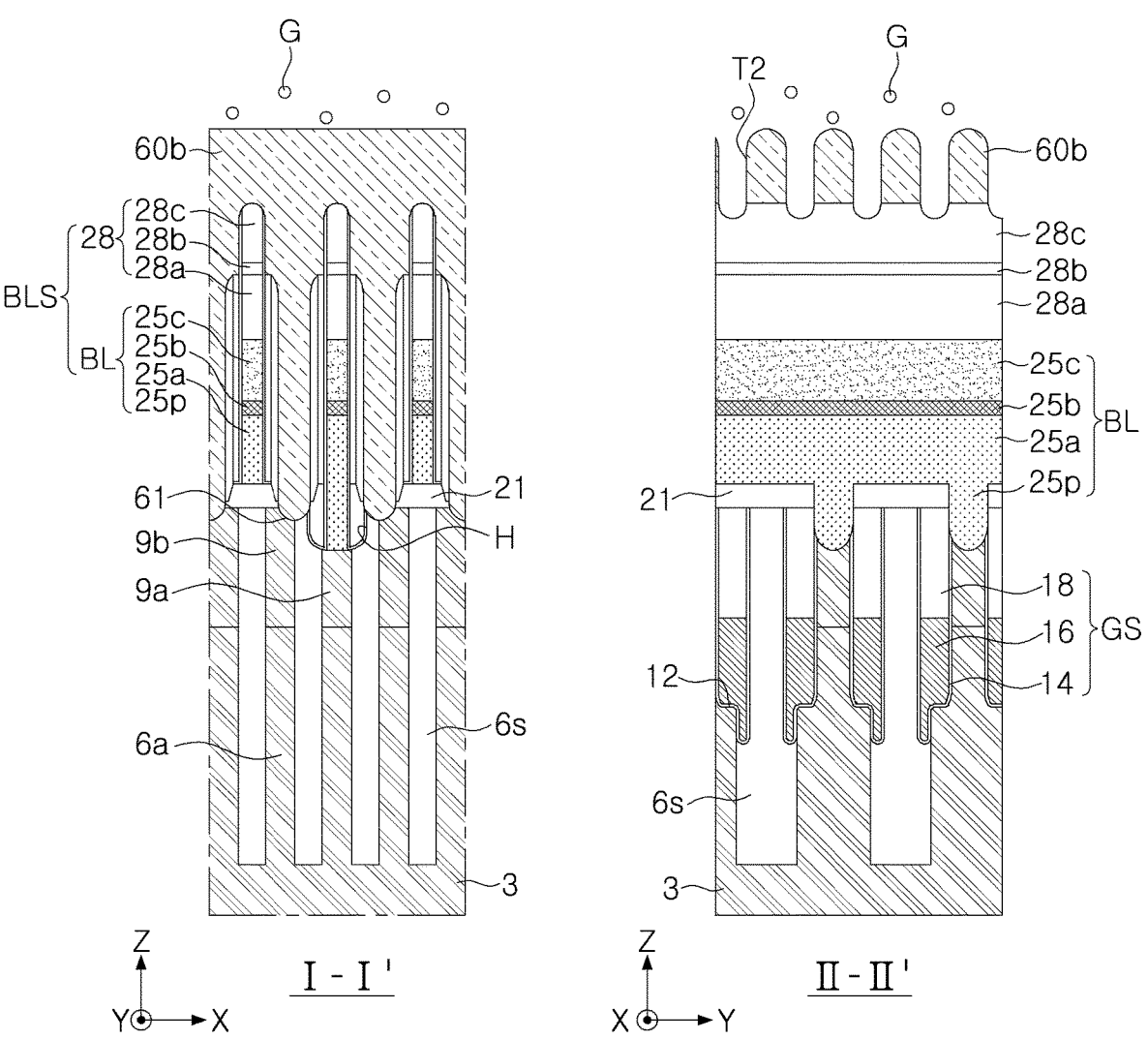
Figure 15B:
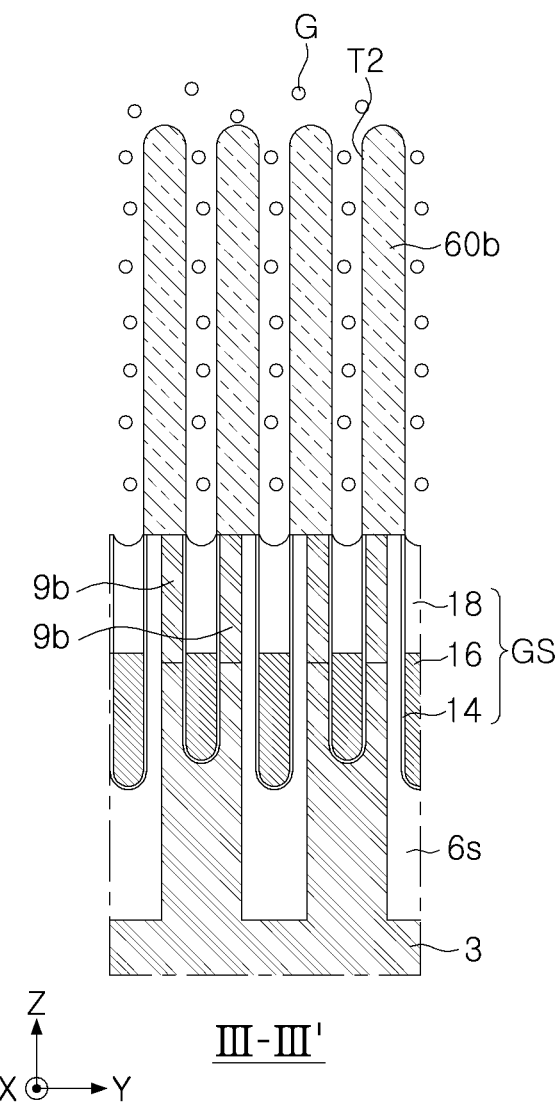

Referring to FIGS. 15A and 15B, a doping process of doping the contact conductive pattern 60b with impurities may be performed. In an embodiment, the doping process may include a gas phase doping (GPD) process using a source gas G including impurities. The impurities may be n-type impurities and may include phosphorus (P), arsenic (As), and/or antimony (Sb) elements. For example, phosphine ($PH_3$) or arsine ($AsH_3$) may be used as a source gas G. In an embodiment, the source gas G may include phosphine ($PH_3$).

As described with reference to FIG. 5, when the doping process is performed by the GPD process, the doping concentration may decrease as the depth from the surface of the contact conductive layer 60a increases. Therefore, entry of impurities into the second impurity region 9b by the doping process may be prevented or reduced, and excessive doping of the second impurity region 9b may be prevented, thereby preventing and reducing gate-induced drain leakage (GIDL).

Due to the doping process, the doping concentration of the side surface of the contact conductive pattern 60b exposed by the second trench T2 may increase. For example, the doping concentration of the contact conductive pattern 60b may be about $1 \times 10^{20}$ atom/cm$^3$ to about $6 \times 10^{20}$ atom/cm$^3$, and the doping concentration of the side surface of the contact conductive pattern 60b exposed by the second trench T2 may be about $3 \times 10^{20}$ atom/cm$^3$ to about $6 \times 10^{20}$ atom/cm$^3$. The doping concentration of the embedded portion 61 not exposed by the second trench T2 may be relatively low.

Figure 16A:
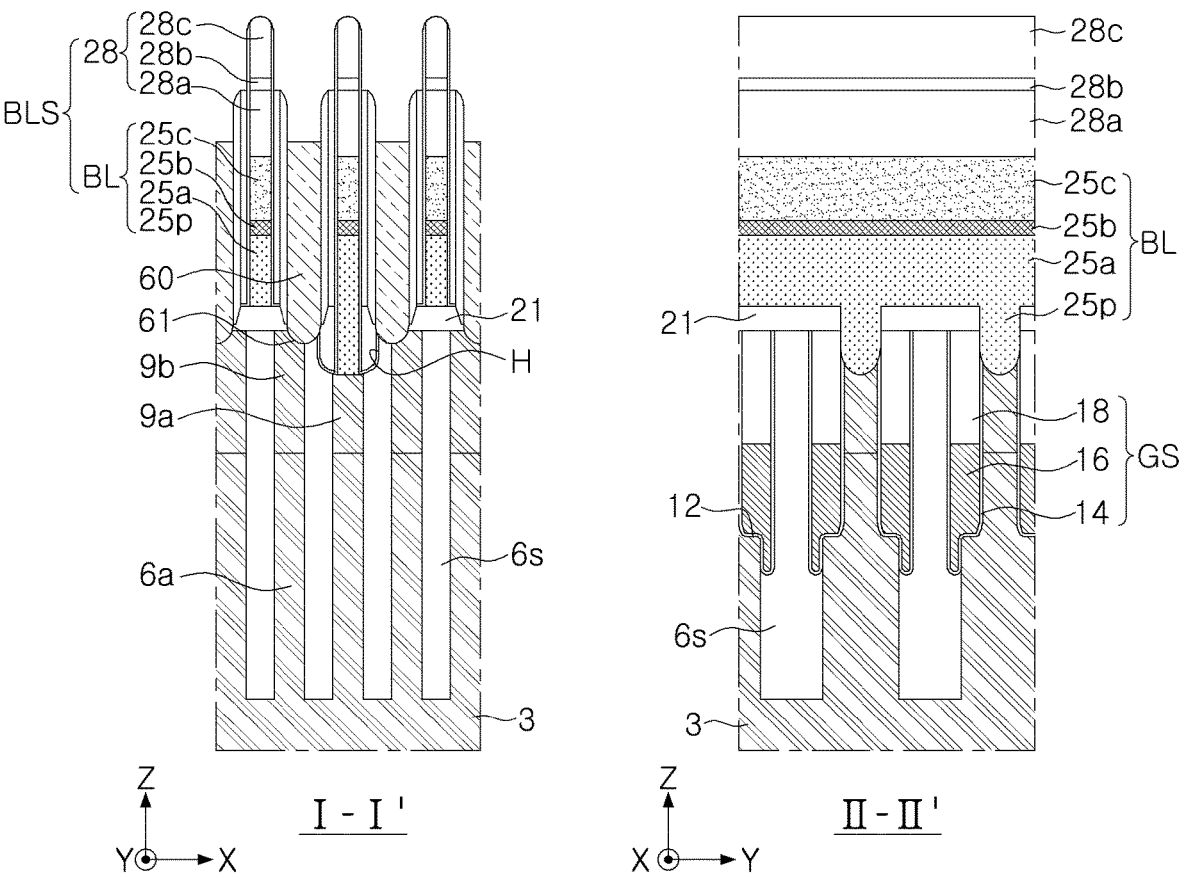
Figure 16B:
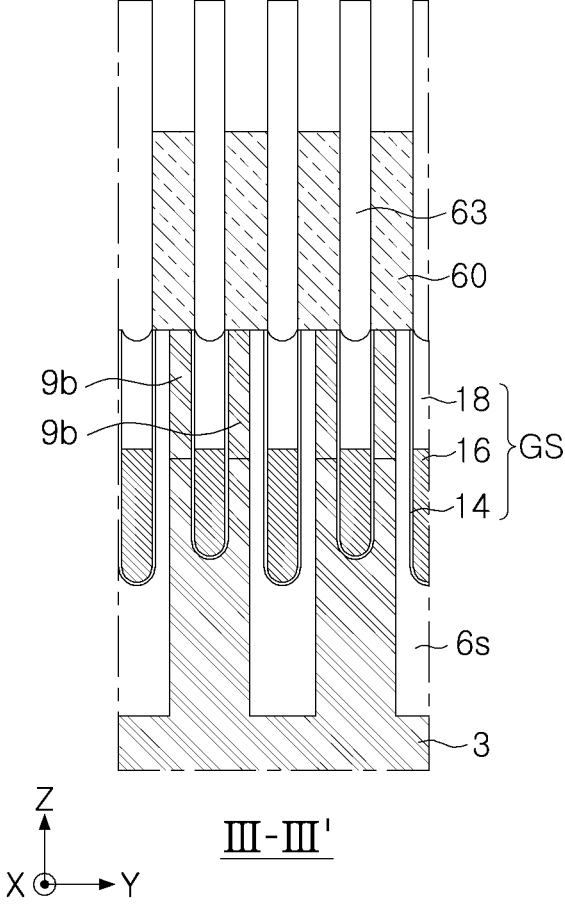

Referring to FIGS. 16A and 16B, the fence structure 63 may be formed. The fence structure 63 may be formed by forming an insulating material on the second trench T2 to fill the second trench T2 and performing a planarization process. The fence structures 63 may overlap the gate structure GS in a vertical direction between the bit line structures BLS. For example, a lower surface of the fence structure 63 may have a downwardly convex curved surface toward the gate structure GS and may contact an upper surface of the gate capping layer 18. The fence structures 63 may be spaced apart from each other in the X and Y-directions.

After the fence structure 63 is formed, the contact plug 60 may be formed by partially etching an upper portion of the contact conductive pattern 60b. For example, the upper surface 60_U of the contact plug 60 may be located on a level that is lower than an upper end of the bit line structure BLS. In addition, the upper surface 60_U of the contact plug 60 may be located on a level that is lower than an upper end of the fence structure 63. The contact plugs 60 may be alternately disposed with the fence structures 63 in the Y-direction between the bit line structures BLS.

Referring back to FIGS. 2A and 2B, the barrier layer 69a and the metal layer 69b may be formed on the bit line structure BLS, the spacer structure SP, and the contact plug 60. The landing pad 69 and the insulating pattern 72 may be formed by patterning the barrier layer 69a and the metal layer 69b and filling them with an insulating material. The metal-semiconductor compound layer 66 may be formed between the contact plug 60 and the landing pad 69. The landing pad 69 may also cover the fence structure 63. The metal-semiconductor compound layer 66 may be formed by siliciding a portion of the contact plug 60.

In an embodiment, before the landing pad 69 is formed, the upper insulation spacer 50 covering upper portions of the bit line structure BLS and the spacer structure SP protruding from the upper surface 60_U of the contact plug 60 may be further formed. The barrier layer 69a may conformally cover the upper insulating spacer 50. The upper insulating spacer 50 may also cover an upper portion of the fence structure 63 protruding from the upper surface 60_U of the contact plug 60.

The semiconductor device 100 may be manufactured by forming the etch stop layer 75 and the capacitor structure 80 on the landing pad 69. The etch stop layer 75 may cover upper surfaces of the landing pad 69 and the insulating pattern 72. The capacitor structure 80 may include the lower electrode 82 connected to the landing pad 69 through the etch stop layer 75, the capacitor dielectric layer 84 on the lower electrode 82, and the upper electrode 86 on the capacitor dielectric layer 84.

In some embodiments, the doping process described above with reference to FIGS. 15A and 15B might not be performed, and the doping process may be performed on the contact plug 60 illustrated in FIGS. 16A and 16B. The doping process may be a GPD process, and as illustrated in FIGS. 7 and 8, the high-concentration region 62 may be disposed along the upper surface 60_U of the contact plug 60.

In some embodiments, after the doping process described above with reference to FIGS. 15A and 15B is performed, a doping process may be further performed on the contact plug 60 illustrated in FIGS. 16A and 16B. The doping process may be a GPD process, and as illustrated in FIGS. 9 and 10, the high-concentration region 62 may be disposed along the upper surface 60_U, the first side surface 60_S1, and the second side surface 60_S2 of the contact plug 60.

According to embodiments of the inventive concept, the contact plug may include the high-concentration region formed on the surface thereof. Accordingly, resistance of the contact plug may be reduced.

According to embodiments of the inventive concepts, gate-induced drain leakage may be prevented and reduced by doping the contact plug by a GPD process to prevent and reduce introduction of impurities into the active region during the doping process.

While example embodiments have been illustrated and described above, it will be apparent to those skilled in the art that modifications and variations could be made without departing from the scope of the present inventive concept.

What is claimed is:

1. A semiconductor device, comprising:
a substrate including an active region;
a gate structure disposed in the substrate and extending to traverse the active region in a first horizontal direction;
bit line structures traversing the gate structure and extending in a second horizontal direction, intersecting the first horizontal direction;
fence structures disposed between neighboring pairs of the bit line structures, the fence structures being spaced apart from each other in the second horizontal direction; and
a contact plug disposed between the neighboring pairs of the bit line structures and between neighboring pairs of the fence structures,
wherein the contact plug includes first and second side surfaces spaced apart from each other in the second horizontal direction and third and fourth side surfaces spaced apart from each other in the first horizontal direction, and
wherein a doping concentration of the first side surface is higher than a doping concentration of the third side surface.

2. The semiconductor device of claim 1, wherein a doping concentration of the contact plug over a depth in the second horizontal direction is highest on at least one of the first and second side surfaces.

3. The semiconductor device of claim 1, wherein a doping concentration of the contact plug over a depth in the second horizontal direction is lowest between the first side surface and the second side surface.

4. The semiconductor device of claim 1, wherein a doping concentration of the contact plug over a depth in the first horizontal direction is constant.

5. The semiconductor device of claim 1, wherein a doping concentration of the contact plug is about $1 \times 10^{20}$ atom/cm$^3$ to about $6 \times 10^{20}$ atom/cm$^3$.

6. The semiconductor device of claim 1, wherein doping concentrations of the first side surface and the second side surface are higher than doping concentrations of the third side surface and the fourth side surface.

7. The semiconductor device of claim 1, wherein
the contact plug includes a first region and a second region having a doping concentration that is lower than a doping concentration of the first region, and
the first region is disposed along the first side surface and the second side surface of the contact plug.

8. The semiconductor device of claim 7, wherein the doping concentration of the first region is about $3 \times 10^{20}$ atom/cm$^3$ to about $6 \times 10^{20}$ atom/cm$^3$.

9. The semiconductor device of claim 7, wherein
the contact plug includes an embedded portion disposed in the substrate and contacting the active region, and
a doping concentration of the embedded portion is lower than doping concentrations of the first region and the second region.

10. The semiconductor device of claim 7, wherein the first region extends along an upper surface of the contact plug.

11. The semiconductor device of claim 10, wherein the doping concentration of the contact plug over the depth in a vertical direction is highest on the upper surface of the contact plug.

12. The semiconductor device of claim 1, wherein the first side surface and the second side surface are each in contact with the fence structures.

13. The semiconductor device of claim 1, wherein the contact plug includes doped polysilicon.

14. The semiconductor device of claim 1, wherein the contact plug includes an n-type impurity.

15. A semiconductor device, comprising:
a substrate including an active region;
a gate structure disposed in the substrate and extending to traverse the active region in a first horizontal direction;
bit line structures traversing the gate structure and extending in a second horizontal direction, intersecting the first horizontal direction;
fence structures disposed between neighboring pairs of the bit line structures, the fence structures being spaced apart from each other in the second horizontal direction; and
a contact plug disposed between the neighboring pairs of the bit line structures and between neighboring pairs of the fence structures,
wherein the contact plug includes an embedded portion, a first region, and a second region disposed on the embedded portion,
wherein a doping concentration of the first region is higher than a doping concentration of the second region,
wherein the first region is disposed along an upper surface of the contact plug and/or a side surface of the contact plug, and
wherein a doping concentration of the contact plug over a depth in a vertical direction is highest on the upper surface of the contact plug and/or the side surface of the contact plug.

16. The semiconductor device of claim 15, wherein a doping concentration of the embedded portion is lower than a doping concentration of the second region.

17. The semiconductor device of claim 15, wherein a doping concentration of the contact plug gradually decreases downwardly from the upper surface of the contact plug.

18. The semiconductor device of claim 15, wherein the doping concentration of the first region is about $3 \times 10^{20}$ atom/cm$^3$ to about $6 \times 10^{20}$ atom/cm$^3$.

19. A semiconductor device, comprising:

a substrate including an active region;

a gate structure disposed in the substrate and extending to traverse the active region in a first horizontal direction;

a first bit line structure and a second bit line structure extending to traverse the gate structure in a second horizontal direction, intersecting the first horizontal direction, the first bit line structure and the second bit line structure being spaced apart from each other in the first horizontal direction;

spacer structures covering side surfaces of the first bit line structure and the second bit line structure;

a first fence structure and a second fence structure disposed between the first bit line structure and the second bit line structure, the first fence structure and the second fence structure being spaced apart from each other in the second horizontal direction;

a contact plug disposed between the first bit line structure and the second bit line structure and between the first fence structure and the second fence structure; and a landing pad disposed on the contact plug, wherein the contact plug includes a first side surface contacting the first fence structure, a second side surface contacting the second fence structure, a third side surface facing the first bit line structure, and a fourth side surface facing the second bit line structure, and wherein doping concentrations of the first side surface and the second side surface are each higher than doping concentrations of both the third side surface and the fourth side surface.

20. The semiconductor device of claim 19, wherein a doping concentration of the contact plug over a depth in the second horizontal direction is highest on the first side surface and/or second side surface.

\* \* \* \* \*